(12) United States Patent
Chien

(10) Patent No.: US 7,057,466 B2
(45) Date of Patent: Jun. 6, 2006

(54) VARACTOR-BASED RING OSCILLATOR

(75) Inventor: Hung-Ming Chien, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 69 days.

(21) Appl. No.: 10/813,276

(22) Filed: Mar. 31, 2004

(65) Prior Publication Data

US 2005/0225404 A1    Oct. 13, 2005

(51) Int. Cl.
*H03B 5/24* (2006.01)
(52) U.S. Cl. .................................... 331/57; 331/177 V
(58) Field of Classification Search ................ 331/1 A, 331/8, 25, 36 C, 57, 177 V
See application file for complete search history.

(56) References Cited

U.S. PATENT DOCUMENTS

| | | | |
|---|---|---|---|
| 2,971,165 A | | 2/1961 | Linn |
| 3,416,100 A | | 12/1968 | Kruse, Jr. et al. |
| 3,813,614 A | | 5/1974 | Darrow et al. |
| 5,012,142 A | * | 4/1991 | Sonntag .................. 327/281 |
| 5,185,581 A | * | 2/1993 | Brown .................... 330/254 |
| 5,191,301 A | * | 3/1993 | Mullgrav, Jr. ............ 331/57 |
| 5,610,560 A | | 3/1997 | Sauer et al. |
| 5,955,929 A | | 9/1999 | Moon et al. |
| 6,842,078 B1 | * | 1/2005 | Manna et al. ............ 331/57 |

OTHER PUBLICATIONS

Miller, C.A., et al., "The Distributed RC Variable-Frequency Phase-Shift Oscillator", vol. 17, No. 4, pp. 457-460, 1978, Pergamon Press Ltd., Great Britain.

* cited by examiner

*Primary Examiner*—David Mis
(74) *Attorney, Agent, or Firm*—Squire, Sanders & Dempsey, L.L.P.

(57) ABSTRACT

A varactor-based ring oscillator to produce an output signal and method therefore are disclosed. The ring oscillator includes a first phase shift circuit having a first pole. The ring oscillator also includes a second phase shift circuit having a second pole and a third phase shift circuit having a third pole. The output of the third phase shift circuit is cross-coupled to the input of the first phase shift circuit. A phase shift circuit of the ring oscillator includes a pole that has a varactor and generates phase shift for the phase shift circuit. The varactor can be adjusted or varied to tune, the phase shift, the phase shift circuit and the frequency of the oscillator. If the varactor is in the final phase shift circuit of the oscillator, the varactor is coupled to a diode that supplies voltage to the varactor. A voltage control signal is applied to the pole, and to the oscillator, to generate the output signal having a specified frequency.

15 Claims, 4 Drawing Sheets

VARACTOR-BASED RING OSCILLATOR

BACKGROUND OF THE INVENTION

1. Field of the Invention

The present invention relates to oscillators within integrated chips or circuits within communication devices, and, more particularly, the present invention relates to an oscillator having three stages, or phase shift circuits, in a cross-coupled configuration for use in a communication device, such as a wireless device.

2. Description of the Related Art

The use of wireless communications for in-home and in-building networks and direct communications is increasing. In conventional communication systems, data may be modulated onto at least one radio frequency (RF) and transmitted. For example, a transceiver may receive the RF modulated signal and demodulates the signal to recapture the data. In wireless applications, the data is modulated and transmitted over a wireless network to a location, or user equipment. The wireless device or user equipment receives the transmitted signal and demodulates it.

Regardless of the communication system or device, a transceiver may include an antenna, a filtering section, a low noise amplifier, an intermediate (IF) stage and a modulator/demodulator. An example is discussed as a receiver, as follows. The antenna receives RF modulated signals and provides them to the filtering section. The filtering section then passes the RF signals of interest to the low noise amplifier. The low noise amplifier may amplify the received RF signals of interest, and provide the amplified signals to the IF stage. The IF stage may include one or more local oscillators, mixers, or adders to step-down the frequency of the RF signals to an intermediate frequency signal, or to base-band signals. The IF stage provides the IF, or base-band signals, to the demodulator. Depending upon the particular protocol, algorithm or method, the demodulator of the example may demodulate the signals to recapture the transmitted data.

Components within the receiver may use an output signal from local oscillators. Oscillators seek to output signals having a specific frequency desired by the communication device or system. Once an oscillator reaches the specified frequency, the oscillator may lock onto the frequency. If the oscillator does not output a signal having the specified frequency, then the oscillator may be adjusted via feedback or other means until the specified frequency is achieved.

Ring oscillators may be used to provide an output signal having a desired frequency. Ring oscillators may include a plurality of stages or phase shift circuits, each one having a delay. The stages also can be referred to as delay cells. Each stage may have a specified phase shift and an overall phase shift within an oscillator of 360 degrees, or 360°. By having two or more stages, a ring oscillator may generate increased noise as well as introduce phase shift errors. These actions degrade the output signal, prevent the oscillator from reaching a desired frequency, and produce an inadequate frequency range for oscillation applications. Further, each stage of the oscillators may increase delay in transferring the output signal to the demodulator.

In addition, oscillators may use a current control implementing a voltage-to-current converter that converts a voltage control signal to a current signal, which in turn controls the oscillator and its resulting output signal. In other words, a control voltage is supplied to the converter that outputs a current control signal to the oscillator. The added component of the converter may increase noise in this particular oscillator.

SUMMARY OF THE INVENTION

According to the preferred embodiments, an oscillator is disclosed. The oscillator includes a first phase shift circuit that includes a first pole. The oscillator also includes a second phase shift circuit that includes a second pole and has an input coupled to an output of the first phase shift circuit. The oscillator also includes a third phase shift circuit that includes a third pole and has an input coupled to an output of the second phase shift circuit. An output of the third phase shift circuit is cross-coupled to an input of the first phase shift circuit. At least one of the first, second and third poles includes a varactor to generate a phase shift of the at least one of the first, second and third poles.

According to the preferred embodiments, a ring oscillator having three stages also is disclosed. The ring oscillator includes a phase shift circuit to tune a frequency of an output signal. The ring oscillator also includes a pole within the phase shift circuit. The pole includes a varactor to provide a capacitance for the pole.

According the preferred embodiments, a circuit for providing a signal also is disclosed. The circuit includes a voltage supply. The circuit also includes an oscillator including at least two phase shift circuits. A final phase shift circuit is cross-coupled with a first phase shift circuit. The circuit also includes a diode coupled to the voltage supply in the final phase shift circuit of the at least two phase shift circuits. The circuit also includes a varactor within a pole of the final shift circuit. The varactor tunes a frequency of a signal generated by the oscillator.

According to the preferred embodiments, a method for generating an output signal in a ring oscillator also is disclosed. The method includes applying a voltage control signal to a pole in a phase shift circuit. The method also includes generating an output signal having a frequency according to the pole. The method also includes generating a phase shift in the phase shift circuit according to the pole.

According to the preferred embodiments, a circuit for generating an output signal also is disclosed. The circuit includes applying means for applying a voltage control signal to a pole in a phase shift circuit. The circuit also includes a first generating means for generating an output signal having a frequency according to the pole. The circuit also includes a second generating means for generating a phase shift in the phase shift circuit according to the pole.

BRIEF DESCRIPTION OF THE DRAWINGS

For proper understanding of the invention, reference should be made to the accompanying drawings, wherein.

DETAILED DESCRIPTION OF THE PREFERRED EMBODIMENT(S)

Reference is now made to the above-disclosed figures to illustrate exemplary embodiments of the present invention. The exemplary embodiments are disclosed in greater detail according to this detailed description and to the appended drawings, wherein like numerals designate like elements.

Figure 1:
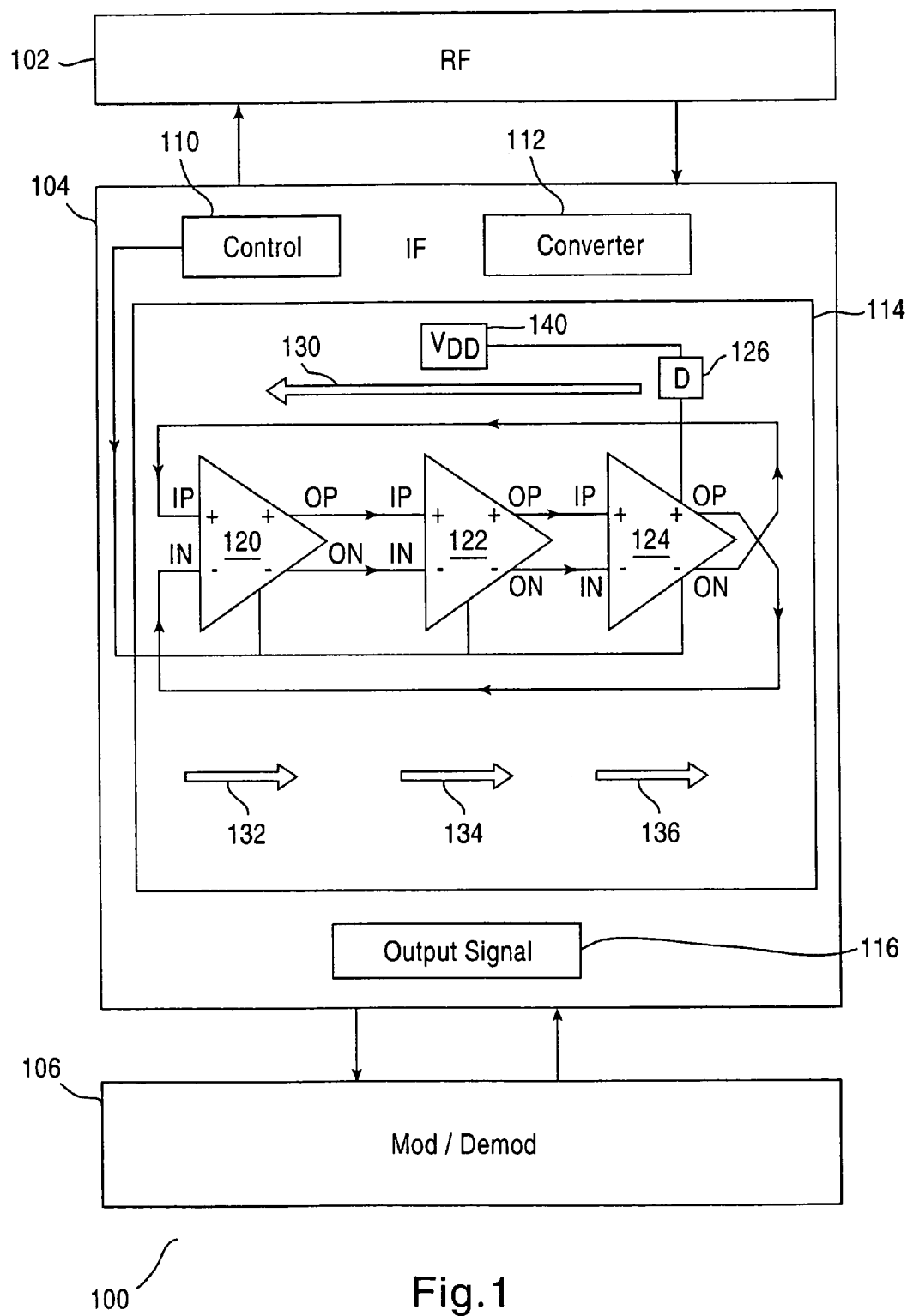
FIG. 1 illustrates a transceiver having a cross-coupled oscillating circuit according to the preferred embodiments.

FIG. 1 illustrates transceiver 100 having cross-coupled oscillating circuit 114 according to the preferred embodiments. Transceiver 100 may be for use in communication systems, devices, methods and the like, and may be included in a wireless communication device to transmit and receive signals over a wireless network or other wireless communications. Transceiver 100 may receive radio frequency (RF) signals that are converted and modulated, or demodulated, according to an application or service. Transceiver 100 is discussed below using an example of a signal received by RF receiver/transmitter 102. Alternatively, transceiver 100 also may send a signal via RF transmitter/receiver 102.

RF receiver/transmitter 102 may receive a signal from another source according to the example. The signal may arrive over a wireless communication network to an antenna coupled to RF receiver/transmitter 102. RF receiver/transmitter 102 may convert the received RF signal to an intermediate, or base-band, signal that allows for greater or increased processing capabilities by the application.

RF receiver/transmitter 102 may send the converted signal to intermediate frequency (IF) component 104. IF frequency component 104 enables oscillating circuit 114 to generate an output signal 116 that has a specified, or desired, frequency. IF component 104 may receive a control signal 110 that specifies the desired frequency, and also may serve as the control signal to initiate generation of output signal 116. Control signal 110 may be a voltage signal that is also provided to converter 112. Converter 112 may convert control signal 110 from a voltage signal to a current signal. Oscillating circuit 114 does not necessarily use a current signal as a control signal, and thus, can receive control signal 110 directly within IF component 104. Thus, converter 112 may be removed or not used to generate output signal 116. Alternatively, converter 112 may produce a current control signal to apply to oscillating circuit 114.

Oscillating circuit 114 includes three stages, which may be phase shift circuits. Oscillating circuit 114 may include phase shift circuits 120, 122 and 124. Phase shift circuits 120, 122 and 124 also may be referred to as delay cells. Phase shift circuit 120 generates phase shift 132. Phase shift circuit 122 generates phase shift 134. Phase shift circuit 124 generates phase shift 136. Phase shift circuits 120–124 may be configured such that the output of phase shift circuit 124 is cross-coupled to the input of phase shift circuit 120. Phase shift 130 may be the cross coupled phase shift produced by the cross-coupled configuration. Phase shift 130 may be, for example, approximately 180 degrees.

In the cross-coupled configuration illustrated in FIG. 1, positive output (OP) of phase shift circuit 120 may be coupled to a positive input (IP) of phase shift circuit 122. Negative output (ON) of phase shift circuit 120 may be coupled to negative input (IN) of phase shift circuit 122. Thus, the output of phase shift circuit 120 may be directly coupled to the input of phase shift circuit 122. Further, an OP of phase shift circuit 122 may be coupled to positive input (IP) of phase shift circuit 124. An ON of phase shift circuit 122 may be coupled to an IN of phase shift circuit 124. Thus, the output of phase shift circuit 122 also may be directly coupled to the input of phase shift circuit 124. Accordingly, an OP of phase shift circuit 124 is cross-coupled to an IN of phase shift circuit 120. An ON of phase shift circuit 124 is cross-coupled to an IP of phase shift circuit 120.

As disclosed above, phase shift circuits 120, 122 and 124 may generate phase shifts 132, 134 and 136. Phase shifts 132, 134 and 136 should be approximately equal to cross-coupled phase shift 130. Cross-coupled phase shift 130 may generate an approximately 180 degrees phase shift. Phase shifts 120, 122 and 124 may generate phase shift values of approximately 60 degrees each. Phase shift circuits 120, 122 and 124 may be adjusted, or tuned, to generate phase shifts 132, 134 and 136. The total phase shift for oscillating circuit 114 should be approximately equal to 360 degrees.

Oscillating circuit 114 may receive control signal 110. Oscillating circuit 114 may react to control signal 110 to generate output signal 116 according to a specified, or desired, frequency. Phase shift circuits 120, 122 and 124 add phase shifts 132, 134 and 136 and generate output signal 116. Phase shift circuits 120, 122 and 124 may be cross-coupled in a ring configuration, as disclosed above. Thus, output signal 116 should not be out of phase with regard to control signal 110 or any other applicable signal.

Modulator/demodulator 106 may receive and use output signal 116. IF component 104 also may use output signal 116. Further, IF component 104 may include additional oscillating circuits 114 that may generate a variety of output signals 116. Additional oscillating circuits 114 preferably may be adjustable, or tunable, to provide different frequencies for the variety of output signals 116.

Oscillating circuit 114 also may include a supply voltage, or $V_{dd}$, 140 that is coupled to the final stage, or phase shift circuit 124, through diode 126. Diode 126 can be coupled to the highest stage within oscillating circuit 114. The highest stage of oscillating circuit 114 may be defined as the stage nearest to the output. Diode 126 may couple supply voltage 140 to other stages of oscillating circuit 114, and is not limited to the highest stage. Diode 126 may be a metal oxide semiconductor (MOS). Further, diode 126 may be a p-channel MOS (PMOS).

Transceiver 100 may be implemented on an integrated circuit or chip, for example, an integrated chip within a communication device for wireless communications. Further, transceiver 100 may operate at various frequencies to produce output signal 116 within a given frequency range. This frequency range may be less than 500 MHz. More specifically, transceiver 100 may operate at, or within, a frequency range of approximately 100 MHz to 200 MHz.

Figure 2:
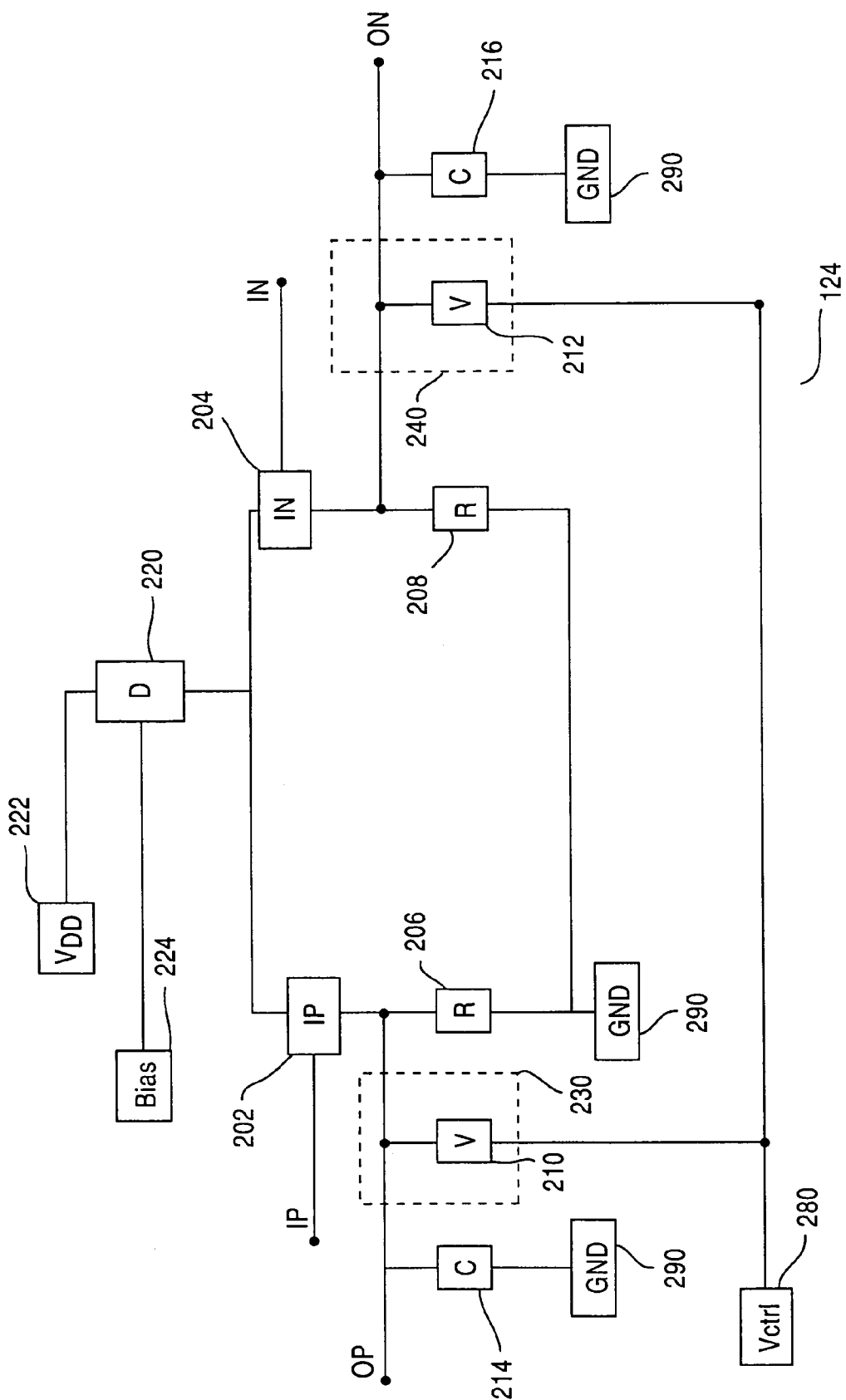
FIG. 2 illustrates a phase shift circuit according to the preferred embodiments.

FIG. 2 illustrates phase shift circuit 124 according to the preferred embodiments. Phase shift circuit 124 may correlate to phase shift circuit 124 disclosed with reference to FIG. 1. FIG. 1, however, is not limited by the disclosure of phase shift circuit 124 with reference to FIG. 2.

Phase shift circuit 124 may reside in an oscillating circuit, such as oscillating circuit 114 of FIG. 1. Phase shift circuit 124 also may be referred to as a stage or a delay cell within the oscillating circuit. Phase shift circuit 124 may be the highest stage, or final delay cell, within the oscillating circuit. For example, phase shift circuit 124 may have outputs OP and ON that are cross-coupled to the inputs of the first stage of the oscillating circuit, such as phase shift circuit 120 of FIG. 1.

Phase shift circuit 124 includes diode 220 that serves as a gate for supply voltage, or $V_{dd}$, 222 and bias voltage 224. Diode 220 may be any conventional diode, but preferably is a PMOS diode coupled to phase shift circuit 124. Supply voltage 222 may be supplied to diode 220 when phase shift circuit 124 is generating an output signal, such as output signal 116, having a specified frequency.

Input gates 202 and 204 also are coupled to diode 220 and also may receive input signals to phase shift circuit 124. The input signal may come from a previous stage or phase shift circuit. Input gate 204 may receive the IN signal from the previous stage. Input gates 202 and 204 are coupled directly to the output of a proceeding stage. Input gates 202 and 204 may include any conventional diode, semiconductor material, P-N junction and the like. Input gates 202 and 204 may be coupled to resistances 206 and 208, respectively. Resistances 206 and 208 may include resistors coupled to ground 290.

Phase shift circuit 124 also includes varactors 210 and 212. Varactors 210 and 212 also may be referred to as "poles" within phase shift circuit 124. For example, pole 230 may include varactor 210. Alternatively, pole 230 may include a resistor and/or a capacitor coupled to varactor 210. Further, pole 230 may be extended to include resistance 206 along with varactor 210. In any event, pole 230 can be adjustable to tune the frequency for an output signal of phase shift circuit 124. Pole 210 also may facilitate in generating the phase shift for phase shift circuit 124. Phase shift circuit 124 also may include capacitances 214 and 216 coupled to ground 290. Capacitances 214 and 216 may include conventional capacitors or any other component that acts as a capacitor.

Poles 230 and 240 are coupled to voltage control signal 280. When phase shift circuit 124 is in an ON state, voltage control signal 280 may be applied to poles 230 and 240. Thus, varactors 210 and 212 are coupled to voltage control signal 280. Being directly coupled voltage control signal 280, the voltage-to-current conversion and its associated components may not be needed within the oscillating circuit. The direct application to voltage control signal 280 may reduce noise within phase shift circuit 124 and any components within the other applicable oscillating circuit.

Varactor 210 may comprise any type of varactor diode, such as an NMOS varactor. More particularly, varactor 201 may be an NMOS within an Nwell configuration. The NMOS varactor in an Nwell configuration may provide more energy, or gain, to the oscillator via phase circuit 124 than other types of diodes. Further, varactor 210 may provide a larger frequency range for tuning and higher charge, or Q. These improvements may result in improved noise reduction, and better phase response within phase shift circuit 124 and reduced errors in the oscillating circuit.

According to FIG. 2, phase shift circuit 124 includes poles 230 and 240. Thus, FIG. 2 discloses a single pole configuration for phase shift 124. The present invention may also include additional poles, such as a two pole configuration. Phase shift circuit 124 can use one pole to adjust, vary, or tune the output signal within phase shift circuit 124. For example, pole 230 may provide the 60 degree phase shift for phase shift circuit 124. If a second pole was coupled with pole 230, then the sum of the phase shift generated by the two poles may equal approximately 60 degrees.

Phase shift circuit 124 is shown as being the final stage in the oscillating circuit, but phase shift circuit 124 of FIG. 2 may apply to any stage within an oscillating circuit. For example, phase circuit 124 and poles 230 may be applicable to the first stage or second stage of oscillating circuit 114 of FIG. 1. All stages of the oscillating circuit may include phase shift circuits having a varactor-based pole for tuning, as disclosed in FIG. 2.

Figure 3:
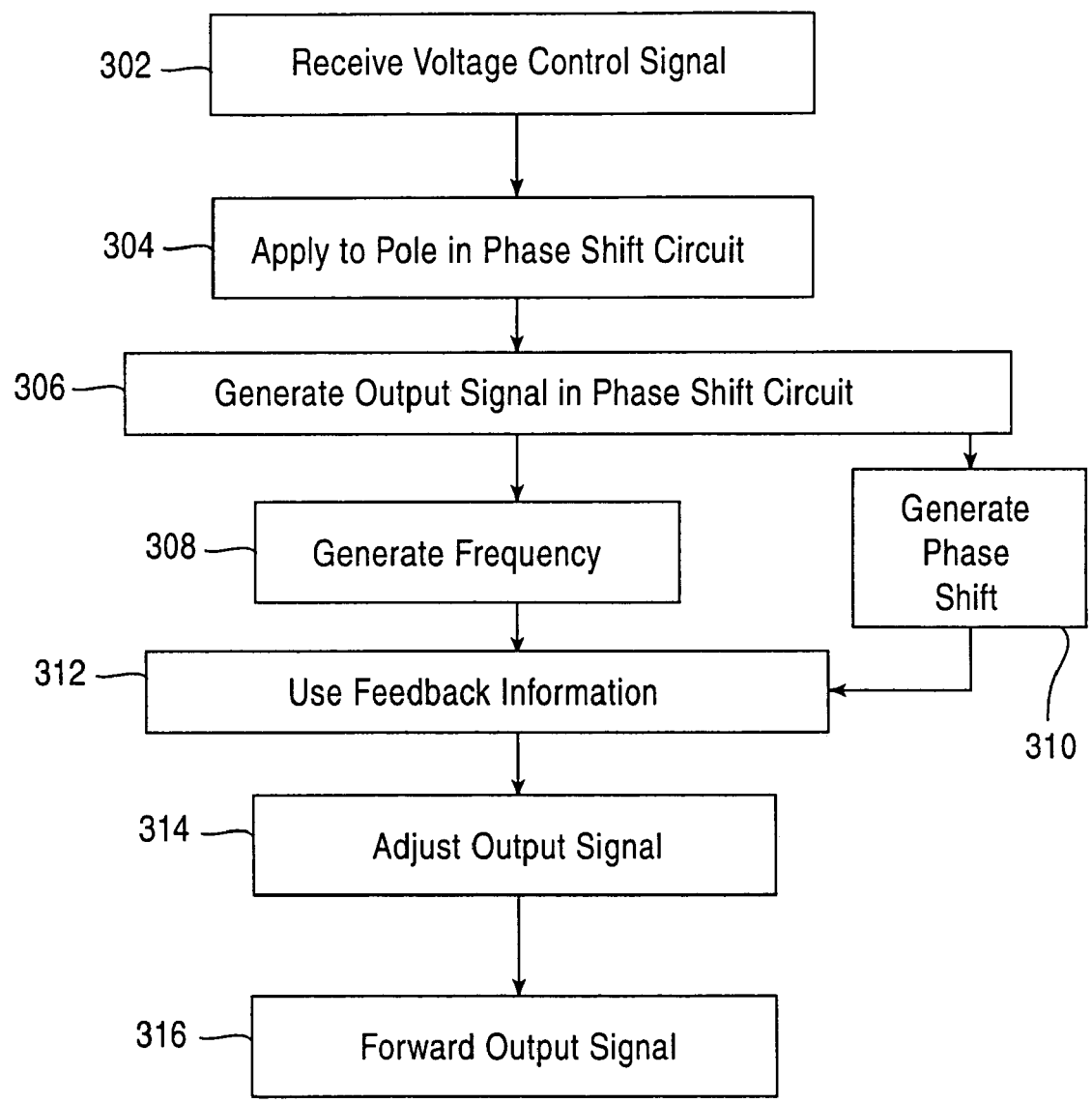
FIG. 3 illustrates a flow chart for generating an output signal in a ring oscillator according to the preferred embodiments.

FIG. 3 illustrates a flow chart generating an output signal in a ring oscillator according to the preferred embodiments. Step 302 executes by receiving a voltage control signal in the ring oscillator. The ring oscillator may include phase shift circuits, or stages. The phase shift circuits may include a pole. Referring to FIG. 1, the ring oscillator includes three phase shift circuits, such as oscillating circuit 114. Step 304 executes by applying the voltage signal to a pole within a phase shift circuit of the phase shift circuits. Step 304 is not limited to a single pole within a single phase shift circuit, but may apply the voltage control signal to any pole within any phase shift circuit. As disclosed above, the pole can be in a final phase shift circuit. Also disclosed above, the pole may include a diode that is used to adjust or vary the frequency of the output signal. The diode may include a varactor.

Step 306 executes by generating an output signal in the phase shift circuit. The output signal also may include components generated by other phase shift circuits within the ring oscillator. Step 308 executes by generating a frequency for the output signal according to the pole within the phase shift circuit. Preferably, the frequency would be a specified or desired frequency activated by the voltage control signal. The pole seeks to generate this frequency for the output signal. Step 310 executes by generating a phase shift for the phase shift circuit according to the pole. Each phase shift circuit within the ring oscillator may have a phase shift generated by respective poles to generate a total phase shift.

Step 312 executes by using feedback information on the output signal to determine and adjust various parameters of the output signal. For example, the generated frequency and phase shift may be analyzed for accuracy or nearness to the desired frequency or phase shift of the output signal. Feedback information in this instance may include a feedback signal, a fractional part of a feedback signal that is determined using to the output signal, and the like.

Step 314 executes by adjusting the output signal according to the feedback information. For example, if the frequency of the output signal was not within a desired range, the pole may be tuned or varied to adjust the output signal and its frequency. Further, if the phase shift is not acceptable, then the output signal may be adjusted accordingly. The pole may include the varactor that is adjusted to change the output signal and its respective components. Step 316 executes by forwarding the output signal of the other components coupled to the ring oscillator. For example, the output signal may be used by a demodulator/modulator in wireless communication applications.

Figure 4A:
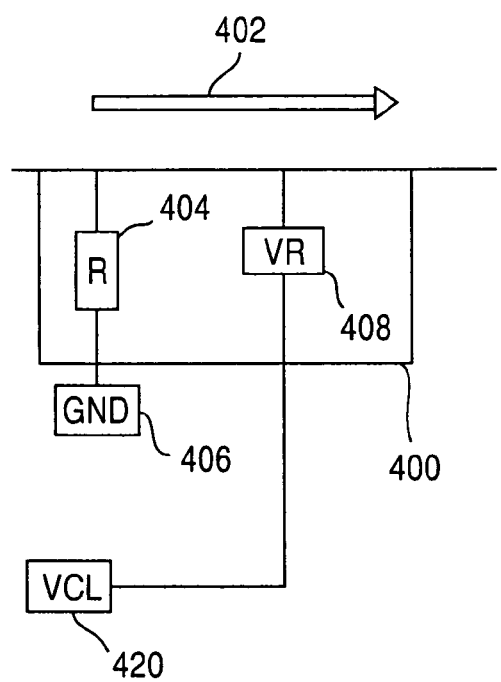
FIG. 4A illustrates a pole according to the preferred embodiments.

FIG. 4A illustrates a circuit configuration for a pole 400 according to the preferred embodiments. Pole 400 correlates to poles 230 and 240 disclosed with reference to FIG. 2. Pole 400 may be an example of a configuration according to the preferred embodiments of the present invention. Poles 230 and 240, however, are not limited by the disclosure of pole 400.

Pole 400 may be activated by voltage control signal 420 to generate phase shift 402. Phase shift 402 may be combined with other phase shifts to create a total phase shift. Pole 400 includes resistance 404 and varactor 408. Resistance 404 may be coupled to ground 406. Resistance 404 and varactor 408 combine to generate a phase shift for phase shift 402. Varactor 408 may be an adjustable element in order to adjust, vary, or tune pole 400.

Varactor 408 may be an n-channel metal oxide semiconductor (NMOS). Alternatively, varactor 408 may be a p-n diode or p-channel MOS. Preferably, varactor 408 may be an NMOS diode having an NWELL configuration.

Figure 5:
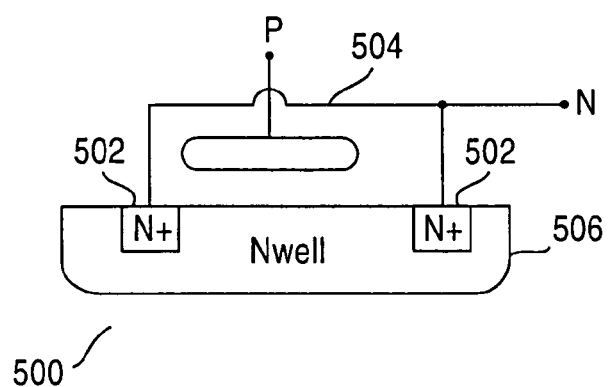
FIG. 5 illustrates a varactor for use in a pole according to the preferred embodiments.

Referring to FIG. 5, NMOS diode 500 may have an NWELL configuration as disclosed according to the preferred embodiments. Gate 504 and $N^+$ contacts 502 may be built on top and inside NWELL 506. Gate 504 and contacts 502 may be the controlling electrode for NMOS diode 500. By applying a positive voltage between gate 504 and NWELL 506, a surface is accumulated such that NMOS diodes 500 capacitance approximately equals the oxide capacitance. The applied voltage may be reversed, and the surface may be depeleted such that the device capacitance of NMOS 400 decreases. Thus, NMOS diode 500 may act a variable capacitor for tuning operations and adjustments in a pole.

Referring back to FIG. 4A, varactor 408 may vary its capacitance in order to adjust phase shift 402. By using the NMOS diode 500 disclosed with reference to FIG. 4, a better Q, or charge, factor may result within a phase shift circuit incorporating pole 400. Further, better noise rejection may result within a larger tuning range. Another feature is a larger maximum current to minimum current ratio, which in turn increases the tuning range. Thus, an oscillating circuit using pole 400 may have increased performance, noise rejection, and charge factor than conventional oscillating circuits. Further, the threshold for the voltage to produce current charge within varactor 408 is kept at or near approximately zero. Keeping the threshold voltage at or near zero improves performance of pole 400 in order to allow the voltage to better fit previous stages or subsequent stages. For example, voltage control signal 420 may be applied to multiple stages, or poles, within an oscillating circuit. Keeping the threshold at or near zero may allow the voltage signal 420 to improve performance.

Figure 4B:
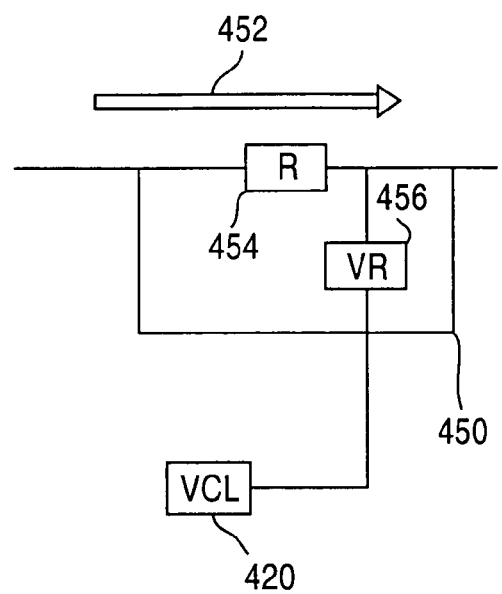
FIG. 4B illustrates another pole according to the preferred embodiments.

FIG. 4B illustrates another circuit configuration for a pole 450 according to the disclosed embodiments. Pole 450 generates phase shift 452. Pole 450 also includes resistance 454 and varactor 456. Varactor 456 may be similar to varactor 408 disclosed with reference to FIG. 4A. Resistance 454 in varactor 456, however, may be configured differently than pole 400. In the configuration disclosed in FIG. 4B, resistance 454 may not be coupled to a ground if phase shift 452 is adjustable, or varied, by varactor 456. Voltage control signal 420 may activate pole 450 to generate phase shift 452.

Though varactors 408 and 456 are disclosed using an NMOS in an NWELL configuration, other diodes and configurations may be implemented within poles 400 and 450 of the present invention. For example, a p-n diode may be used to tune any oscillating circuit using poles 400 or 450. Further, varactors 408 or 456 may use a PMOS in a PWELL configuration in order to generate phase shifts and reduce noise in an oscillating circuit.

Thus, one having ordinary skill in the art will readily understand that the invention as discussed above may be practiced with steps in a different order, and/or with elements configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims and their equivalents.

I claim:

1. An oscillator, comprising:
    a first phase shift circuit including a first pole;
    a second phase shift circuit including a second pole, and having an input coupled to an output of said first phase shift circuit; and
    a third phase shift circuit including a third pole, and having an input coupled to an output of said second phase shift circuit, wherein an output of said third phase shift circuit is cross-coupled and directly connected to an input of said first phase shift circuit,
    wherein at least one of said first, second and third poles includes a varactor to generate a phase shift according to said at least one of said first, second and third poles.

2. The oscillator of claim 1, wherein said at least one of said first, second or third poles generates said phase shift, said phase shift comprising approximately ⅓ of a cross-coupled phase shift.

3. The oscillator of claim 1, wherein the varactor comprises an n-channel metal oxide semiconductor.

4. The oscillator of claim 3, wherein the varactor comprises the n-channel metal oxide semiconductor in an Nwell configuration.

5. The oscillator of claim 1, wherein the varactor comprises a capacitance to the at least one of said first, second or third poles.

6. The oscillator of claim 5, wherein the capacitance allows a frequency to be tuned.

7. The ring oscillator of claim 1, wherein the varactor comprises an n-channel metal oxide semiconductor.

8. The ring oscillator of claim 7, wherein the varactor comprises the n-channel metal oxide semiconductor in an Nwell configuration.

9. A ring oscillator having three stages, the ring oscillator comprising:
    a phase shift circuit to tune a frequency of an output signal; and
    a pole within the phase shift circuit, wherein the pole includes a varactor to provide a capacitance for the pole;
    further comprising a first stage and a final stage, wherein an output of the final stage is cross-coupled and directly connected to an input of the first stage.

10. The ring oscillator of claim 9, wherein the final stage comprises the phase shift circuit.

11. The ring oscillator of claim 9, wherein the pole comprises a resistance.

12. A circuit for providing a signal, the circuit comprising:
    a voltage supply;
    an oscillator including at least two phase shift circuits, wherein a final phase shift circuit is a cross-coupled and directly connected to a first phase shift circuit;
    a diode coupled to the voltage supply and the final phase shift circuit of the at least two phase shift circuits; and
    a varactor within a pole of the final phase shift circuit, wherein the varactor tunes a frequency of a signal generated by the oscillator.

13. The circuit of claim 12, wherein the varactor comprises an n-channel metal oxide semiconductor.

14. The circuit of claim 13, wherein the varactor comprises the n-channel metal oxide semiconductor in a Nwell configuration.

15. A circuit for generating an output signal, the circuit comprising:
    applying means for applying a voltage control signal to a pole within a phase shift circuit;
    first generating means for generating an output signal having a frequency according to the pole; and
    second generating means for generating a phase shift in the phase shift circuit according to the pole;
    further comprising a first stage and a final stage, wherein an output of the final stage is cross-coupled and directly connected to an input of the first stage.

* * * * *